United States Patent
Kowalczyk

(10) Patent No.: US 8,542,551 B2
(45) Date of Patent: Sep. 24, 2013

(54) CIRCUIT AND METHOD FOR REDUCING LEAKAGE CURRENT

(75) Inventor: Dariusz Kowalczyk, Kanata (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 235 days.

(21) Appl. No.: 13/194,165

(22) Filed: Jul. 29, 2011

(65) Prior Publication Data

US 2013/0028031 A1 Jan. 31, 2013

(51) Int. Cl.
*G11C 5/14* (2006.01)

(52) U.S. Cl.
USPC .......................... 365/226; 365/227

(58) Field of Classification Search
USPC .......................... 365/226, 227, 229
See application file for complete search history.

(56) References Cited

U.S. PATENT DOCUMENTS

| 5,053,996 | A | | 10/1991 | Slemmer et al. |
| 5,424,985 | A | | 6/1995 | McClure et al. |
| 5,673,219 | A | * | 9/1997 | Hashimoto ................... 365/149 |
| 7,639,556 | B2 | | 12/2009 | Yang et al. |
| 2005/0017754 | A1 | * | 1/2005 | Ker et al. .......................... 326/81 |
| 2007/0262809 | A1 | * | 11/2007 | Thomas et al. ................ 327/534 |
| 2010/0090725 | A1 | | 4/2010 | Imai et al. |
| 2012/0092072 | A1 | | 4/2012 | Upputuri et al. |

* cited by examiner

*Primary Examiner* — Vu Le
(74) *Attorney, Agent, or Firm* — Lowe Hauptman & Ham, LLP

(57) ABSTRACT

A circuit comprises a first voltage source, a second voltage source, a first switch, firsts transistors, and a control circuitry. The first switch is configured to selectively couple the first voltage source or the second voltage source to a first signal line. The first transistors are in an IO circuitry and have first bulks configured to receive the first signal line. The control circuitry is configured to receive a clock and a command signal on a command signal line, and generate a first control signal on a first control signal line to control the first switch based on the clock and the command signal.

20 Claims, 14 Drawing Sheets

US 8,542,551 B2

CIRCUIT AND METHOD FOR REDUCING LEAKAGE CURRENT

FIELD

The present disclosure is related to circuits and methods for reducing leakage currents.

BACKGROUND

As advanced technologies evolve, controlling leakage current becomes more and more important. Currently, in various applications, the bulks of MOS transistors are connected directly to a regular voltage source. For example, the bulks of NMOS transistors are coupled to a first voltage source providing a reference voltage VSS while the bulks of PMOS transistors are coupled to a second voltage source providing an operational voltage VDD. Such configurations, though, result in some leakage current, but the leakage current is acceptable for existing applications in slower semiconductor technology nodes such as 130 nm. For faster applications in advanced semiconductor nodes such as 40 nm, the once-acceptable leakage current is no longer acceptable. New mechanisms are needed to better control the leakage current.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
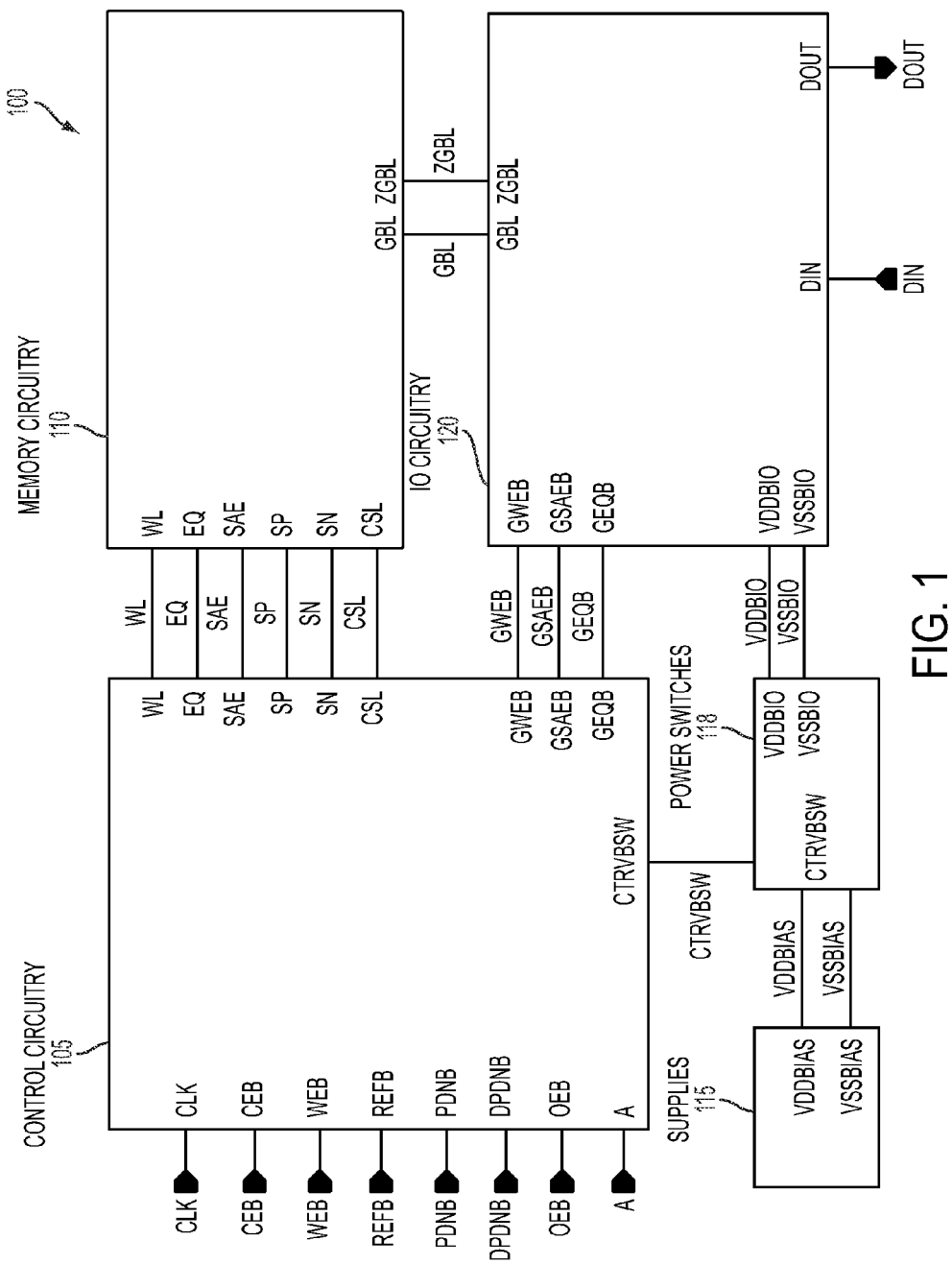
FIG. 1 is a block diagram of an embedded DRAM macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The bulks of MOS transistors in peripheral circuits of an embedded DRAM (eDRAM) are configured to selectively receive a regular operational voltage or a back bias voltage. For example, in a regular operational mode, the bulks of the PMOS transistors in the peripheral circuitry are configured to receive the regular operational voltage VDD while the bulks of NMOS transistors are configured to receive the regular reference voltage VSS. In a standby mode, a deep power down mode, or a power down mode, however, the bulks of the PMOS transistors are configured to receive the back bias voltage VDDBIAS, and the bulks of NMOS transistors are configured to receive the back bias voltage VSSBIAS. As a result, the leakage current in the standby mode, the deep power down mode, and the power down mode in the peripheral circuitry is reduced. In some embodiments, charge pumps are provided to generate the back bias voltages VDDBIAS and VSSBIAS.

Exemplary Memory Circuits

FIG. 1 is a block diagram of an embedded DRAM (eDRAM) 100, in accordance with some embodiments. eDRAM 100 is commonly called a DRAM macro.

In some embodiments, eDRAM 100 operates in the active mode, the standby mode, the power down mode, and the deep power down mode. The active mode includes a write operation and a read operation. In a write operation, external data is written to the memory cells. In a read operation, the data stored in the memory cell is read out to other circuitries (not shown).

The standby mode includes a refresh operation in memory circuitry 110 in which the data stored in the memory cells is refreshed. For example, the memory cells are rewritten based on the data stored in the memory cells. In some embodiments, the refresh operation includes an external refresh and an internal refresh.

In some embodiments in which a deep power mode is implemented, operational voltage VDD is provided to DRAM macro 100 through a power switching circuit, such as a PMOS transistor, to an internal operational voltage node VDDM (not labeled). In the deep power down mode, the power switching circuit is turned off to electrically disconnect operational voltage VDD from internal operational voltage node VDDM that provides supply voltages to circuitries in macro 100. Effectively, node VDDM is floating and no operation can be performed for macro 100. As a result, power is saved, and leakage current is reduced. In some embodiments, the data in the memory cells are lost. A macro 100 having a deep power down mode can also have a power down mode. In embodiments that do not have a deep power down mode, operational voltage VDD is directly provided to node VDDM, and macro 100 includes a power down mode. In the power down and the deep power down mode, there is no active operation in memory circuitry 110, supplies 115, and peripheral circuitry 120. For example, none of the nodes in those circuitries are switching, the power supplies are off, and there is no refresh, etc. In some embodiments, the power down mode cuts off clock CLK to macro 100, stops refreshing, and disables internal power supplies such as the voltage sources that generate voltage VBB, voltage VPP, etc. As a result, power is saved. In some embodiments, the data in the memory cells is also lost in the power down mode.

Control circuitry 105 includes logic circuits (not shown) that, based on input commands to memory 100, generate signals to memory circuitry 110, peripheral circuitry 120, power switches 118, etc., so that the corresponding circuit can operate in the appropriate mode such as the active mode, the standby mode, the power down mode, and the deep power down mode. For example, in the standby mode, control circuitry 105 generates signal CTRVBSW having a high logic value so that the bulks of PMOS and NMOS transistors in IO circuitry 120 respectively receive bias voltages VDDBIAS and VSSBIAS as explained with reference to FIG. 6 below.

In some embodiments, control circuitry 105 receives clock signal CLK as an input clock. Signal CEB is an input synchronous command indicating an active or a standby mode. In some embodiments, circuit 100 operates in the active mode when signal CEB is Low. But when signal CEB is High, circuit 100 operates in the standby mode. Address signals ADD provide the address of the memory cells selected for a write or a read operation. Synchronous read-write enable signal WEB enables a write operation or a read operation. In some embodiments, the write operation is enabled when signal WEB is logically low (Low), and the read operation is enabled when signal WEB is logically high (High). Synchronous refresh enable signal REFB enables or disables an external refresh. When signal REFB is Low, an external refresh operation is enabled. But when signal REFB is High, the external refresh operation is disabled. Signal PDNB indicates whether circuit 100 is in the power down mode. In some embodiments, when signal PDNB is Low, circuit 100 enters the power down mode. But when signal PDNB is High, circuit 100 exits the power down mode. Signal DPDNB indicates whether circuit 100 is in the deep power down mode. In some embodiments, when signal DPDNB is Low, circuit 100 enters the deep power down mode. But when signal DPDNB is High, circuit 100 exits the deep power down mode. Signal OEB indicates whether a data output buffer is enabled. In some embodiments, when signal OEB is Low, the data output buffer is enabled. But when signal OEB is High, the data output buffer is disabled.

Control power switch signal CTRVBSW controls switches in power switches 118. In some embodiments, when signal CTRVBSW is High, voltage VDDBIAS and voltage VSSBIAS from supplies 115 are passed to the respective voltages VDDBIO and VSSBIO in power switches 118. In various embodiments, the bulks of PMOS transistors in peripheral circuit 120 are configured to receive voltage VDDBIO, and the bulks of NMOS transistors in peripheral circuit 120 are configured to receive voltage VSSBIO. As a result, when signal CTRVBSW is High, the bulks of PMOS transistors in peripheral circuitry 120 are electrically connected to voltage VDDBIAS, and the bulks of NMOS transistors in peripheral circuitry 120 are electrically connected to voltage VSSBIAS.

Supply circuitry or Supplies 115 includes charge pumps and voltage regulators that generate various voltages, including, for example, VCP, VBL, VPP, VBB, VSSB, VDDBIAS, VSSBIAS, etc. Various voltages are not shown in FIG. 1. In some embodiments, voltage VDDBIAS is higher than operational voltage VDD and is generated by a charge pump (not shown). Similarly, voltage VSSBIAS is lower than conventional reference voltage VSS, and is also generated by a charge pump.

Power switch circuitry or power switches 118 include switches used to selectively pass voltage VDD or voltage VDDBIAS to voltage VDDBIO. Similarly, power switches 118 also include switches used to selectively pass voltage VSS or voltage VSSBIAS to voltage VSSBIO. Voltage VDDIO is provided to the bulks of PMOS transistors while voltage VSSIO is provided to the bulks of NMOS transistors in peripheral circuitry 120.

Peripheral or input/output (IO) circuitry 120 includes circuits related to a read or a write operation. Data DIN and DOUT are the data for use with external circuitry (not shown). For example, data DIN is processed to be written to memory cells in memory circuit 110 in a write operation. In contrast, in a read operation, data stored in the memory cells is transferred to data DOUT for use by the external circuitry. In some embodiments, the bulks of PMOS transistors in peripheral circuitry 120 are electrically connected to voltage VDDBIO, and the bulks of NMOS transistors in peripheral circuitry 120 are electrically connected to voltage VSSBIO. Further, regular operational voltages VDD and VSS are passed to the respective voltages VDDBIO and VSSBIO and thus to the corresponding bulks of PMOS and NMOS transistors in peripheral circuitry 120 in the active mode. In contrast, bias voltages VDDBIAS and VSSBIAS are passed to the respective voltages VDDBIO and VSSBIO and thus to the corresponding bulks of PMOS and NMOS transistors in peripheral circuitry 120 in the standby mode, the power down mode, and the deep power down mode. Effectively, in various embodiments, voltages VDDBIAS and VSSBIAS are applied at the bulks of the respective PMOS and NMOS transistors in the operational modes in which there is no activity in peripheral circuitry 120. In some embodiments, in the standby mode, the power down mode, and the deep power down mode, signals related to circuits in peripheral circuitry 120 are not switching (inactive).

Memory circuitry 110 includes memory cells and related circuitry for a write or a read operation of the memory cells. Memory circuitry 110 will be described in detail with reference to FIG. 7.

Figure 2:
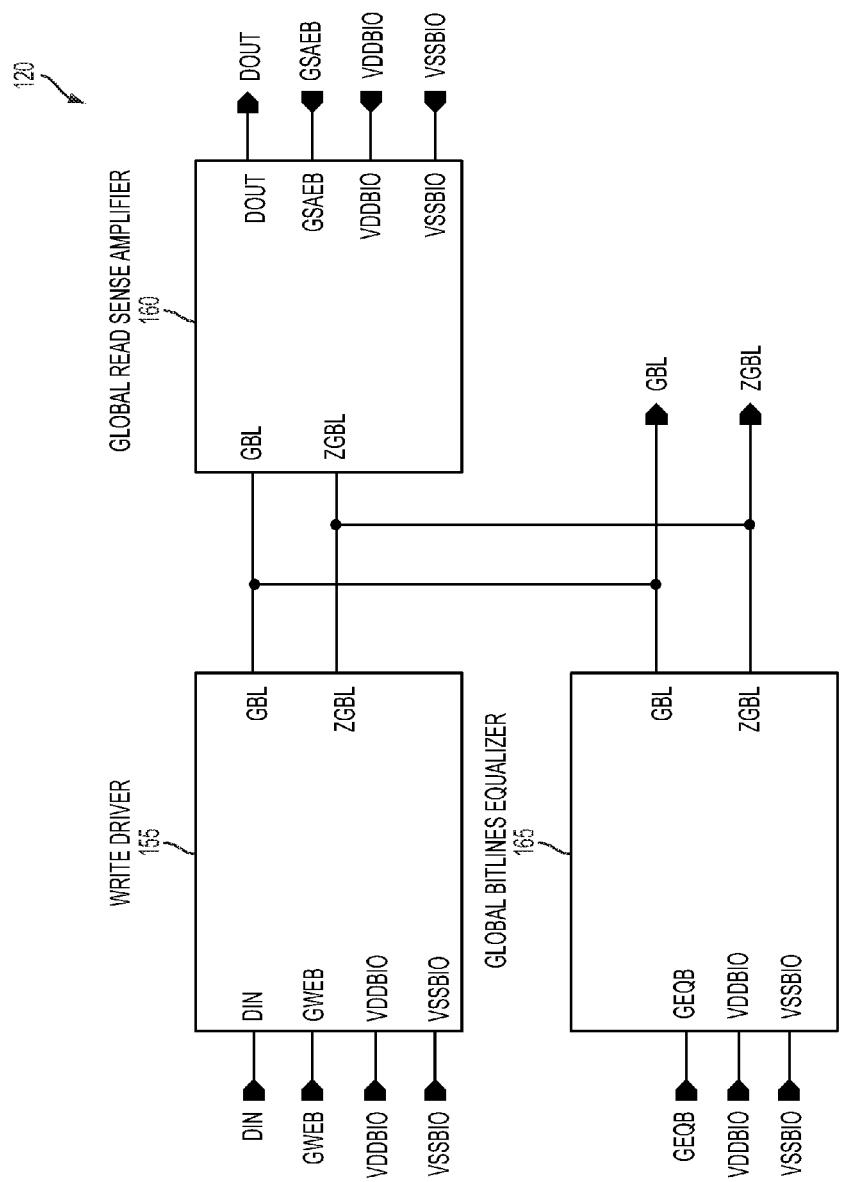
FIG. 2 is a block diagram of the peripheral circuitry of FIG. 1, in accordance with some embodiments.

FIG. 2 is a block diagram of peripheral circuitry 120, in accordance with some embodiments. Write driver 155, global read sense amplifier 160, and global bitlines equalizer 165 receive voltages VDDBIO and VSSBIO for the respective bulks of PMOS and NMOS transistors that will be shown in detail in FIGS. 3, 4, and 5.

Write driver 155 includes circuits to write input data DIN to the memory cells in memory circuitry 110. For example, write driver 155 receives input data DIN and passes the data to global bit lines GBL and ZGBL that is then passed to the corresponding local sense amplifiers and memory cells in memory circuitry 110. In some embodiments, global bit lines GBL and ZGBL are electrically connected to the local sense amplifiers through access transistors (illustrated in FIG. 7). Signal GWEB is used to enable or activate write driver 155. In some embodiments, when signal GWEB is Low, write driver 155 is in the active mode and enables the passing of the input data DIN to global bit lines GBL and ZGBL. But when signal GWEB is High, write driver 155 is in the standby mode, and disables the passing of data DIN to global bit lines GBL and ZGBL.

Global read sense amplifier 160 includes circuits that amplify the data read from the memory cells in memory circuitry 110. In some embodiments, global read sense amplifier 160 amplifies and passes the data on global bit lines GBL and ZGBL to output data DOUT. In some embodiments, when signal GSAEB is Low, global read sense amplifier 160 is in the active mode, amplifying and passing the data on global bit lines GBL and ZGBL to output data DOUT. In contrast, when signal GSAEB is High, global read amplifier 160 is in the standby mode, disabling amplifying the data.

Global bitlines equalizer 160 includes circuits used to pre-charge global bit lines GBL and ZGBL to a stable voltage level in the standby mode. In some embodiments, the stable voltage level is operational voltage VDD. In some embodiments, when signal GEQB is Low, global bitlines equalizer 160 is in the standby mode in which global bit lines GBL and ZGBL are pre-charged to voltage VDD. In contrast, when signal GEQB is High, global bitlines equalizer 160 is in the active mode, and global bit lines GBL and GBL are not pre-charged.

In some embodiments, in the active mode, either one of write driver 155 or global read sense amplifier 160 is active. In this mode, global bit lines GBL and ZGBL are not pre-charged. In a write operation, the data from input DIN are passed through write driver 155, global bit lines GBL and ZGBL, and the local sense amplifiers, to the memory cells. In a read operation, the data are passed from the local sense amplifiers through global bit lines GBL and ZGBL and global read sense amplifier 160 to output data DOUT. In the standby mode, both write driver 155 and global read sense amplifier 160 are not active, and the global bit lines GBL and ZGBL are pre-charged.

In various embodiments, various transistors in each of circuits 155, 160, and 165 of peripheral circuitry 120 are switched in an active mode. In contrast, all transistors are not switched in an inactive mode that includes the standby mode, the power down mode, and the deep power down mode. In such embodiments, various transistors in peripheral circuitry 120 are put in the inactive mode when peripheral circuitry 120 is in an inactive mode. When peripheral circuitry 120 is in an active mode, however, transistors in peripheral circuitry 120 are put in an active or normal mode. In some embodiments, peripheral circuitry 120 is inactive when circuit 100 is not reading or writing.

Figure 3:
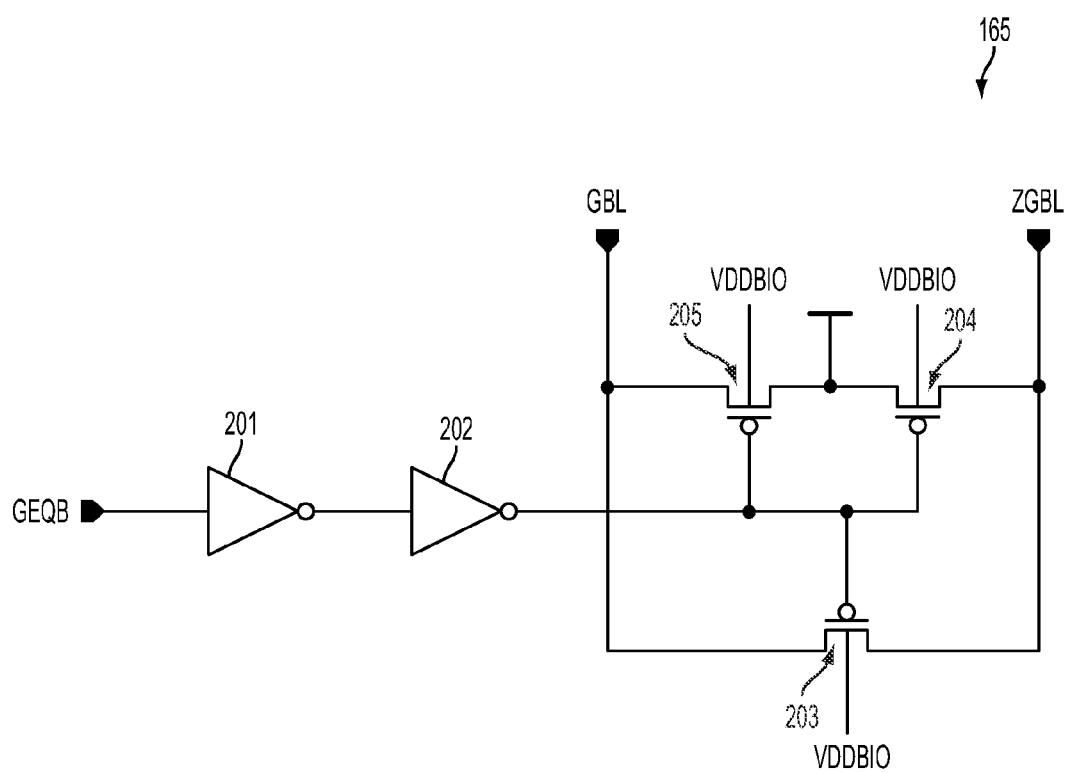
FIG. 3 is a detailed diagram of the global bitlines equalization, in accordance with some embodiments.
Figure 4:
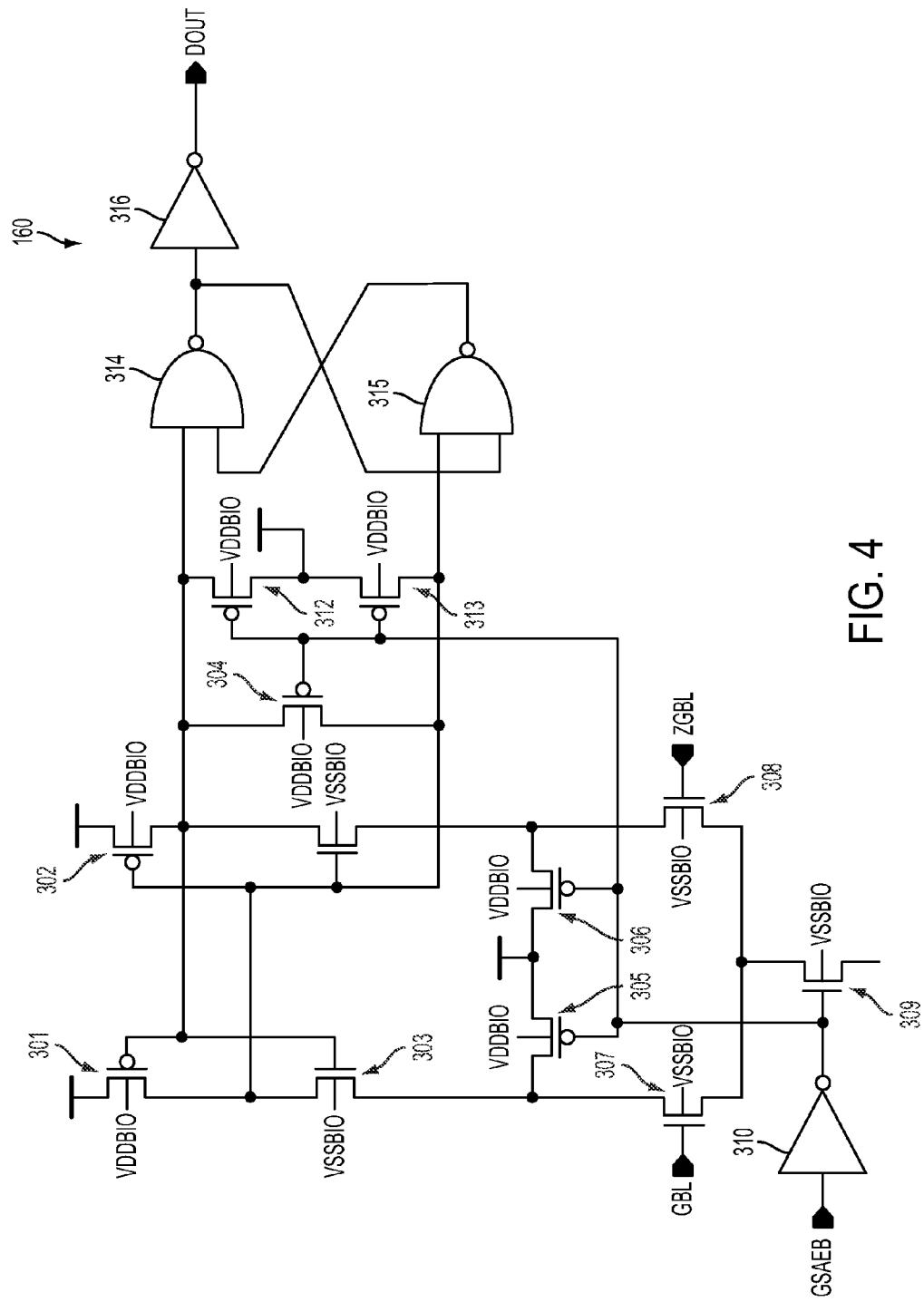
FIG. 4 is a detailed diagram of the global read sense amplifier, in accordance with some embodiments.
Figure 5:
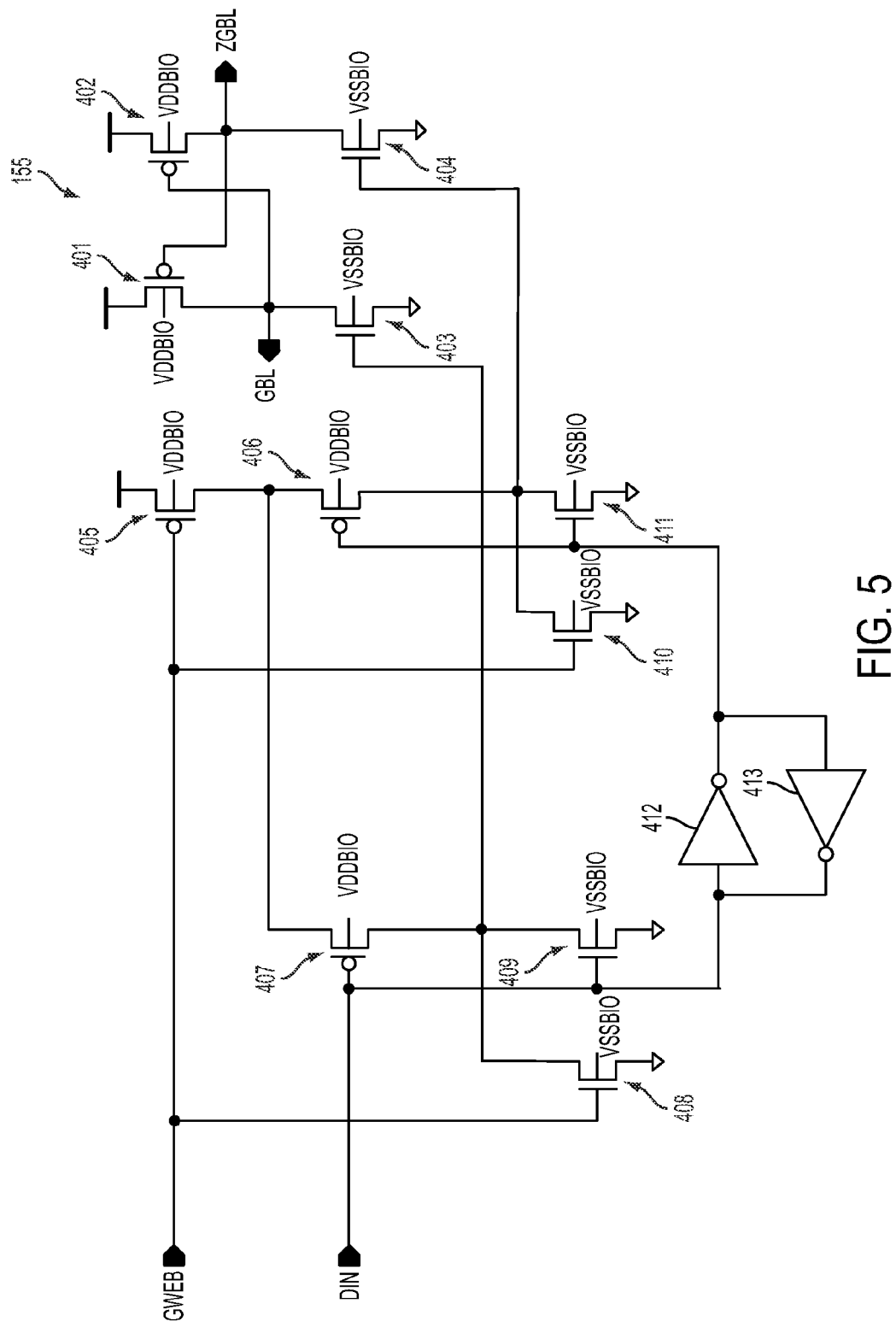
FIG. 5 is a detailed diagram of the write driver, in accordance with some embodiments.

FIGS. 3, 4, and 5 are diagrams of detailed circuits of global bitlines equalizer 165, global read sense amplifier 160, and write driver 155, respectively. The functional details of circuits 165, 160, and 155, however, are not described.

As shown in FIGS. 3-5, the bulks of PMOS transistors in each circuit 165, 160, and 155 are configured to receive voltage VDDBIO while the bulks of NMOS transistors are configured to receive voltage VSSBIO. For example, in FIG. 3, the bulks of PMOS transistors 203, 204, and 205 are configured to receive voltage VDDBIO. In FIG. 4, the bulks of PMOS transistors 301, 302, 304, etc., are configured to receive voltage VDDBIO while the bulks of NMOS transistors 307, 308, 309, etc., are configured to receive voltage VSSBIO. In FIG. 5, the bulks of PMOS transistors 405, 406, 407, etc., are configured to receive voltage VDDBIO while the bulks of NMOS transistors 408, 409, 410, etc., are configured to receive voltage VSSBIO. For simplicity, inverters 201 and 202 in circuit 165 are shown at that gate level (versus the transistor level). Similarly, in circuit 160, NAND gates 314 and 315 and inverters 310 and 316, and, in circuit 155, inverters 412 and 413 are shown at the gate level. NAND gates 314 and 315, and inverters 201, 202, 310, 316, 412, and 413, however, include PMOS and NMOS transistors as would be recognizable by persons of ordinary skill in the art. The bulks of PMOS transistors in NAND gates 314 and 315 and in inverters 201, 202, 310, 316, 412, and 413 are configured to receive voltage VDDBIO. Similarly, the bulks of NMOS transistors in NAND gates 314 and 315 and in inverters 201, 202, 310, 316, 412, and 413 are configured to receive voltage VSSBIO.

The Switching Circuits

Figure 6:
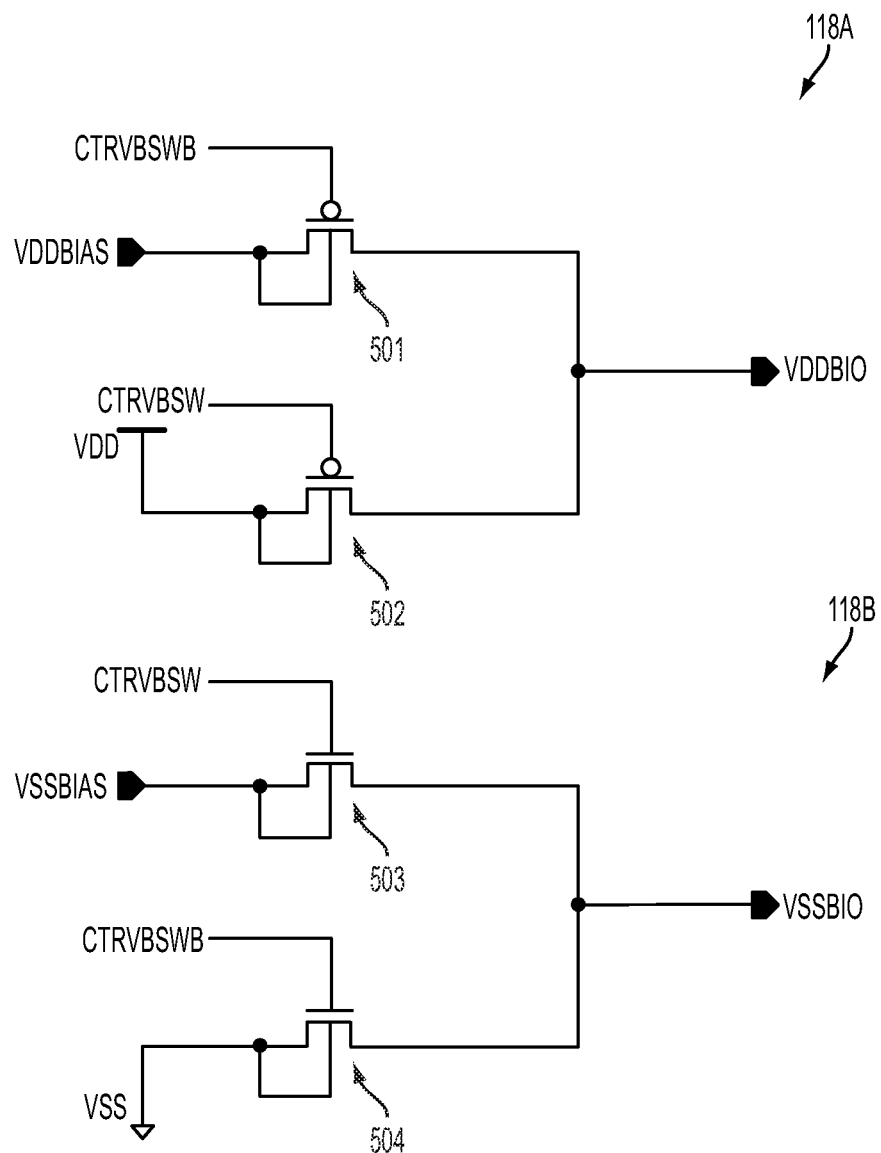
FIG. 6 is detailed diagrams of the power switches, in accordance with some embodiments.
Figure 6:
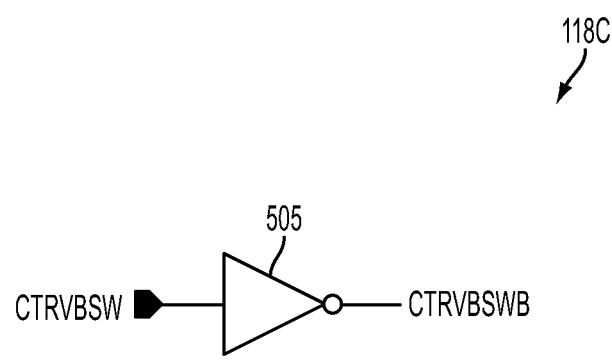

FIG. 6 is a diagram of power switches 118, in accordance with some embodiments. Power switches 118 include circuits 118A, 118B, and 118C. Circuits 118A and 118B generate voltages VDDBIO and VSSBIO, respectively. Circuit 118C generates signal CTRVBSWB.

Switching circuit 118A includes PMOS transistors 501 and 502 that serve to provide the respective voltage VDDBIAS or voltage VDD to voltage VDDBIO. The drains of transistors 501 and 502 are coupled together and to voltage VDDBIO. The source of transistor 501 is coupled to voltage VDDBIAS while the source of transistor 502 is coupled to voltage VDD. Signal CTRVBSWB is used to turn on or off transistor 501. For example, when signal CTRVBSWB is applied with a Low, transistor 501 is turned on. But when signal CTRVBSWB is applied with a High, transistor 501 is turned off. Similarly, signal CTRVBSW is used to turn on or off transistor 502. For example, when signal CTRVBSW is applied with a Low, transistor 502 is turned on. But when signal CTRVBSW is applied with a High, transistor 502 is turned off. In some embodiments, signal CTRVBSWB is an inverse logic of signal CTRVBSW. For example, power switches 118 includes an inverter (shown in circuit 118C) that receives signal CTRVBSW as an input and provides signal CTRVBSWB as an output. As a result, either one of transistors 501 and 502 is on at a time.

In some embodiments, voltage VDDBIO is electrically coupled to back bias voltage VDDBIAS or operational voltage VDD through respective transistors 501 and 502, depending on the operational modes of peripheral circuitry 120. For example, when peripheral circuitry 120 is active or in a normal operation, voltage VDDBIO is electrically coupled to voltage VDD. At that time, PMOS transistor 502 is on, and PMOS transistor 501 is off. As a result, voltage VDD at the source of transistor 502 is passed to the drain of transistor 502 or voltage VDDBIO. In contrast, when peripheral circuitry 120 is inactive or in one of the standby mode, the power down mode and the deep power down mode, voltage VDDBIO is electrically coupled to voltage VDDBIAS. At that time, PMOS transistor 501 is on, and PMOS transistor 502 is off. Voltage VDDBIAS at the source of transistor 501 is passed to the drain of transistor 501 or voltage VDDBIO. Effectively, voltage VDDBIO is electrically coupled to voltage VDDBIAS.

When voltage VDDBIO is coupled to voltage VDDBIAS, the absolute value |Vtp| of the threshold voltage Vtp of PMOS transistors in peripheral circuitry 120 increases. As a result, the leakage current between the source and the drain of PMOS transistors receiving voltage VDDBIO at their bulks is reduced, which is advantageous over other approaches.

Switching circuit 118A including transistors 501 and 502 is used for illustration. Other circuitry selectively passing voltage VDDBIAS or voltage VDD to voltage VDDBIO is within the scope of various embodiments. For example, a switch, or a pass gate can be used in place of a transistor 501 or 502 to pass the respective voltage VDDBIAS or voltage VDD to voltage VDDBIO.

In some embodiments:

$$|VDDBIAS| = VDD + \Delta bias$$

wherein VDD is about 0.85 V and Δbias is about 0.35 V

Voltage Δbias and thus voltage VDDBIAS is selected based on the ability of transistors 501 and the PMOS transistors receiving voltage VDDBIAS at their bulks. For example, voltage VDDBIAS is selected such that transistor 501 continues to function properly when voltage VDDBIAS is applied at the source of transistor 501. Those of ordinary skill in the art will recognize that a high voltage value applied at the source of a PMOS transistor can damage that PMOS transistor. Similarly, voltage VDDBIAS is selected such that the PMOS transistors in peripheral circuitry 120 that receive voltage VDDBIAS at their bulks continue to functions properly when voltage VDDBIAS is electrically coupled to voltage VDDBIO and thus to the bulks of those PMOS transistors. Those of ordinary skill in the art will also recognize that a high voltage value applied at the bulk of a PMOS transistor can damage that PMOS transistor. Voltage Δbias and thus voltage VDDBIAS vary depending on the technology nodes, such as 60 nm, 45 nm, 48 nm, etc.

Switching circuit 118B includes NMOS transistors 503 and 504 that serve to provide the respective voltage VSSBIAS or voltage VSS to voltage VSSBIO. The drains of transistors 503 and 504 are coupled together and to voltage VSSBIO. The source of transistor 503 is coupled to voltage VSSBIAS while the source of transistor 504 is coupled to voltage VSS. Signal CTRVBSW is used to turn on or off transistor 503. For example, when signal CTRVBSW is applied with a High, transistor 503 is turned on. But when signal CTRVBSW is applied with a Low, transistor 503 is turned off. Similarly, signal CTRVBSWB is used to turn on or off transistor 504. For example, when signal CTRVBSWB is applied with a High, transistor 504 is turned on. But when signal CTRVBSWB is applied with a Low, transistor 504 is turned off.

In some embodiments, signal CTRVBSWB is an inverse logic of signal CTRVBSW. Signal CTRVBSWB and CTRVBSW are applied at the respective gates of transistors 501 and 504 and transistors 502 and 503. As a result, both transistors 501 and 503 are on at the same time while both transistors 502 and 504 are off at the same time. In contrast, both transistors 501 and 503 are off at the same time while both transistors 502 and 504 are on at the same time. In other words, when the bulks of PMOS transistors in peripheral circuitry 120 receive voltage VDDBIAS, the bulks of NMOS transistors in peripheral circuitry 120 receive voltage VSSBIAS. But when the bulks of PMOS transistors in peripheral circuitry 120 receive voltage VDD, the bulks of NMOS transistors in peripheral circuitry 120 receive voltage VSS. Such embodiments are for illustration. In some embodiments, the bulks of PMOS transistors in peripheral circuitry 120 receive voltage VDDBIAS, but the bulks of NMOS transistors in peripheral circuitry 120 receive voltage VSS. In some embodiments, the bulks of PMOS transistors in peripheral circuitry 120 receive voltage VDD while the bulks of NMOS transistors in peripheral circuitry 120 receive voltage VSSBIAS.

In some embodiments, voltage VSSBIO is electrically coupled to voltage VSSBIAS or operational voltage VSS through respective transistors 503 and 504, depending on the operational status of peripheral circuitry 120. In some embodiments, when peripheral circuitry 120 is active or in a normal operation, voltage VSSBIO is electrically coupled to voltage VSS. At that time, PMOS transistor 504 is on, and PMOS transistor 503 is off. As a result, voltage VSS at the source of transistor 504 is passed to the drain of transistor 504 or voltage VSSBIO. In contrast, when peripheral circuitry 120 is inactive or in one of the standby mode, the power down mode or the deep power down mode, voltage VSSBIO is electrically coupled to voltage VSSBIAS. At that time, PMOS transistor 503 is on, and PMOS transistor 504 is off. Voltage VSSBIAS at the source of transistor 503 is passed to the drain of transistor 503 or voltage VSSBIO. Effectively, voltage VSSBIO is electrically coupled to voltage VSSBIAS.

When voltage VSSBIO is coupled to voltage VSSBIAS, the threshold voltage Vtn of NMOS transistors in peripheral circuitry 120 increases. As a result, the leakage current between the source and the drain of NMOS transistor receiving voltage VSSBIO at their bulks is reduced, which is advantageous over other approaches.

Switching circuit 118B including transistors 503 and 504 is used for illustration. Other circuitry selectively passing voltage VSSBIAS or voltage VSS to voltage VSSBIO is within the scope of various embodiments. For example, a switch or a pass gate can be used in place of a transistor 503 or 504 to pass the respective voltage VSSBIAS or voltage VSS to voltage VSSBIO.

In some embodiments:

$$VSSBIAS = VSS - \Delta bias$$

wherein VSS is 0 V and Δbias is about 0.35 V

Voltage Δbias and thus voltage VSSBIAS are selected based on the ability of transistors 503 and the NMOS transistors receiving voltage VSSBIAS at their bulks. For example, voltage VSSBIAS is selected such that transistor 503 continues to function properly when voltage VSSBIAS is applied at the source of transistor 503. Those of ordinary skill in the art will recognize that a large negative voltage value applied at the source of an NMOS transistor can damage that NMOS transistor. Similarly, voltage VSSBIAS is selected such that the NMOS transistors in peripheral circuitry 120 that receive voltage VSSBIAS at their bulks continue to function properly when voltage VSSBIAS is electrically coupled to voltage VSSBIO and thus to the bulks of those NMOS transistors. Those of ordinary skill in the art will also recognize that a large negative voltage value applied at the bulk of an NMOS transistor can damage that NMOS transistor. Voltage Δbias and thus voltage VSSBIAS vary depending on the technology nodes, such as 60 nm, 45 nm, 48 nm, etc.

In various embodiments, the leakage current between the drain and the source of each PMOS transistor in peripheral circuitry 120 is reduced when peripheral circuitry 120 is inactive and the bulks of each PMOS transistor in peripheral circuit 120 receives voltage VDDBIAS. Similarly, the leakage current between the drain and the source of each NMOS transistor in peripheral circuitry 120 is reduced when peripheral circuitry 120 is inactive and the bulks of each NMOS transistor in peripheral circuit 120 receives voltage VSSBIAS.

In some embodiments, peripheral circuitry 120 includes numerous PMOS and NMOS transistors. The reduction in leakage current from each of the PMOS and NMOS transistor in peripheral circuitry 120 in the standby mode, the deep power down mode, or the power down mode results in a significant reduction in the total leakage current for memory 100. For example, in some embodiments, when VDDBIAS=VDD=0.9V and VSSBIAS=VSS=0V, for a typical process at 25° C. and a fast process at 125° C., the total leakage current per single IO is 52 nA and 5.2 μA, respectively. For the same process and temperature conditions when VDDBIAS=VDD+0.35 V and VSSBIAS=VSS−0.35 V, the leakage current is 37 nA and 3.2 μA, respectively.

Circuit 118C includes inverter 505 that inverts signal CTRVBSW to generate signal CTRVBSWB, in accordance with some embodiments. Other circuitries inverting signal CTRVBSW to generate signal CTRVBSWB are within the scope of various embodiments.

The Memory Circuit

Figure 7:
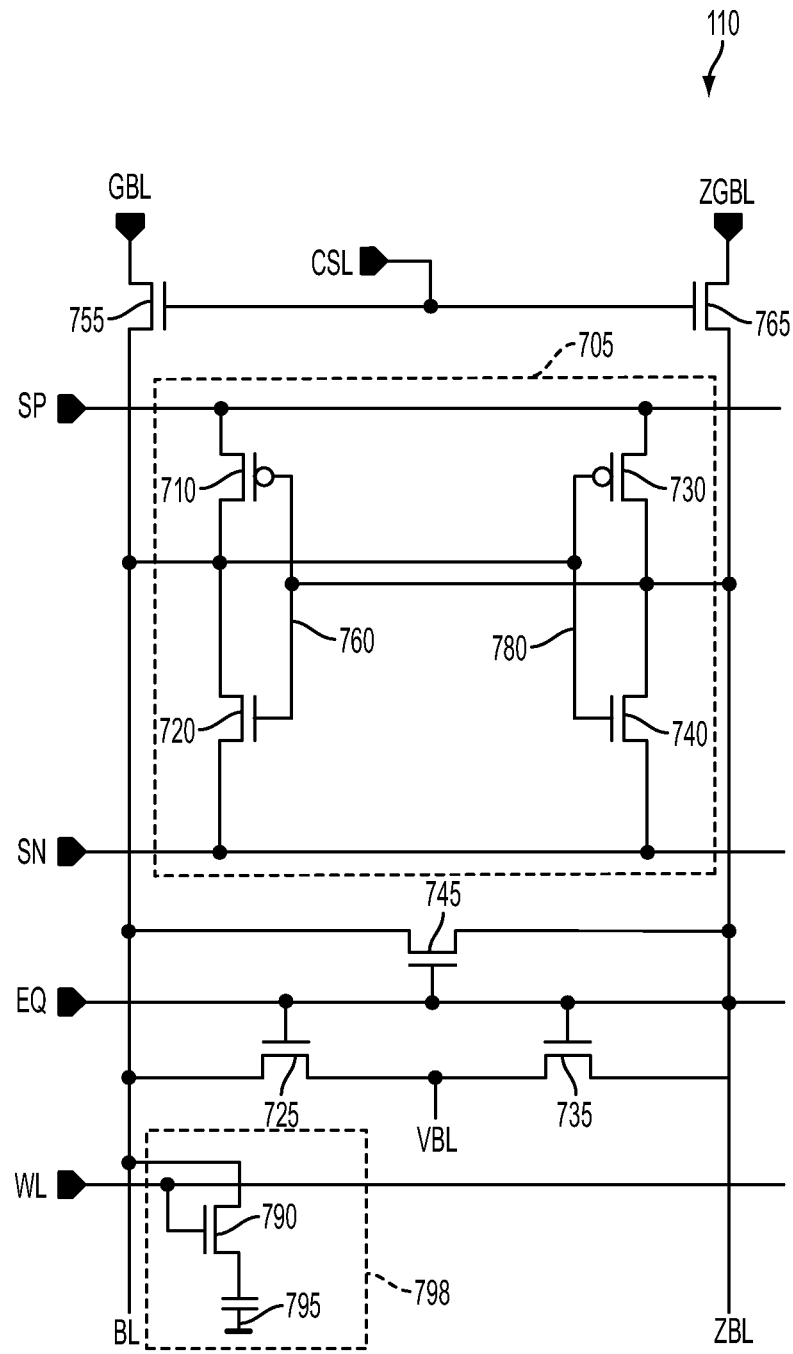
FIG. 7 is a detailed diagram of the memory circuitry, in accordance with some embodiments.

FIG. 7 is a diagram of a memory circuit 110, in accordance with some embodiments.

Column select signal CSL and transistors 755 and 765 enable the data transfer between the pair of local bit lines BL and ZBL and the pair of global bit lines GBL and ZGBL, respectively.

Signal EQ and transistors 725, 735, and 745 are used to pre-charge and equalize bit lines BL and ZBL. When signal EQ is applied with a High, transistors 725, 735, and 745 are turned on, enabling bit lines BL and ZBL to be at the same voltage level VBL at the drains of transistors 725 and 735. Stated differently, bit lines BL and ZBL are pre-charged and equalized to voltage VBL.

Bit cell 798 includes pass gate transistor 790 and memory cell 795. Transistor 790 allows access between local sense amplifier 705 and memory cell 795 through the pair of bit lines BL and ZBL. In some embodiments, bit lines BL and ZBL are connected to an equal number of bit cells 798, but only one bit cell 798 is shown for illustration. In some embodiments, memory cell 795 is a capacitor storing charges. When memory cell 795 is electrically connected to a bit line BL as shown in FIG. 7, memory cell 795 shares the same charge with bit line BL. Depending on the charge indicating the logic value of memory cell 795, bit line BL is pulled one way or another. For example, if memory cell 795 stores a Low, bit line BL is pulled towards ground. Conversely, if memory cell 795 stores a High, bit line BL is pulled towards voltage VDD. After sharing the charge, the voltage difference between bit line BL and bit line ZBL starts to develop. The voltage difference between bit line BL and bit line ZBL is commonly called a bit line split.

Bit lines BL and ZBL serve as both data input and output (IO) for sense amplifier 705. In some embodiments, in a write cycle, applying a logic value to a first bit line, and the opposite logic value to the other bit line, enables writing the logic level at the first bit line to memory cell 795. In a read cycle, sensing or reading the logic values at bit lines BL and ZBL reveals the data stored in memory cell 795. For example, once the bit line split is sufficiently large, sense amplifier 705 amplifies the bit line split, providing a full swing signal on bit lines BL and ZBL that represent the data to be read from memory cell 795. For example, if memory cell 795 stores a High, then sensing bit line BL reveals a High. Conversely, if memory cell 795 stores a Low then sensing bit line BL reveals a Low.

Word line WL is used to turn on or off memory pass gate transistor 790 to allow access to memory cell 795 through transistor 790. In the example of FIG. 7, bit cell 798 is electrically coupled to bit line BL for illustration. Depending on implementations in a memory array, some bit cells 798 are connected to bit line BL while some other bit cells 798 are connected to bit line ZBL. When word line WL at the gate of transistor 790 is applied with a Low, transistor 790 is turned off. The corresponding memory cell 795 is therefore electrically disconnected from bit line BL or from sense amplifier 705. When word line WL is applied with a High, however, transistor 790 is turned on. The corresponding memory cell 795 is electrically connected to bit line BL.

Signals SP and SN are used to turn on or off sense amplifier 705. Signal SP is commonly called the positive supply voltage while signal SN is commonly called the negative supply voltage, even though signal SN has a positive voltage in many situations. In general, when signals SP and SN are at a same level, amplifier 705 is off. But when signal SP is at operational voltage VDD and signal SN is at ground level or voltage VSS, sense amplifier 705 is on.

Local sense amplifier 705 includes transistors 710, 720, 730, and 740. The pair of PMOS transistors 710 and 730, and the pair of NMOS transistors 720 and 740 form the sensing pairs for sense amplifier 705. When a bit line split of bit lines BL and ZBL is sufficiently developed, sense amplifier 705 is turned on to sense or amplify the bit line split and generate a full swing signal on local bit lines BL and ZBL that represent the data read from memory cell 795. Sense amplifier 705 also restores the data to memory cell 795, and sends the data to the corresponding global bit lines GBL and ZGBL.

In some embodiments, in the active mode, local sense amplifier 705 is active. There is some access to memory cell 195, for example, when word line WL is High for a write or a read operation. There is some access from global bit lines GBL and ZGBL to local bit lines BL and ZBL, for example, when column select signal is High. Further, global bit lines GBL are switching. In the standby mode, sense amplifier 705 is also active. There is some access to memory cell 195, for example, when word line WL is High for a refresh operation. However, there is no access from global bit lines GBL and ZGBL to local bit lines BL and ZBL. Global bit lines GBL and ZBL are pre-charged to a stable level.

Exemplary Waveforms

Figure 8:
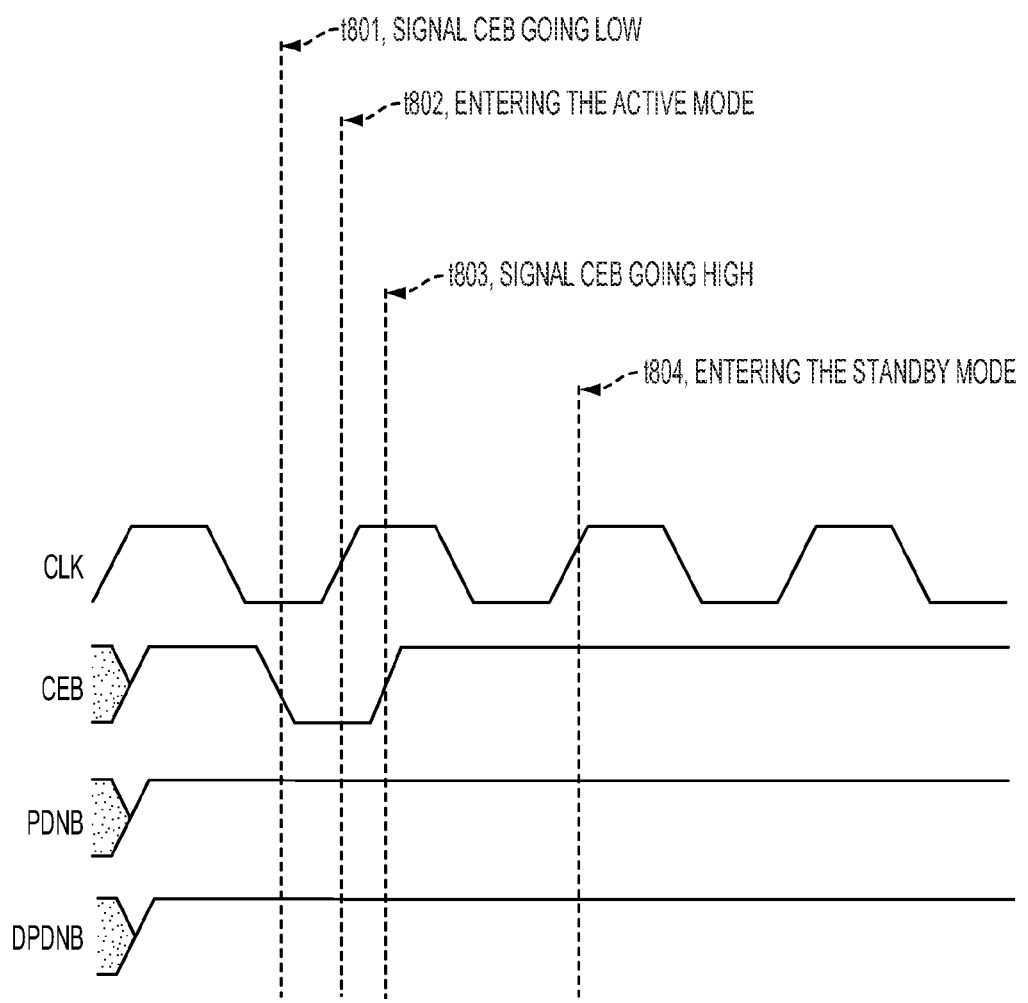
FIG. 8 is a graph of waveform illustrating the memory circuit in FIG. 1 transitioning from the active mode to the standby mode, in accordance with some embodiments.

FIG. 8 is a graph of waveforms illustrating circuit 100 transitioning from the active mode to the standby mode. In the active mode and standby mode, both signals PDNB and DPDNB are High. For illustration, signal CEB transitions from a High to a Low at time t801. In some embodiments, at time t802 when clock CLK first rises to a High after signal CEB is Low, circuit 100 enters the active mode. For further illustration, at time t803, signal CEB transitions from a Low to a High. In some embodiments, at time t804 when clock CLK first rises to a High after signal CEB is High, circuit 100 enters the standby mode.

Figure 9:
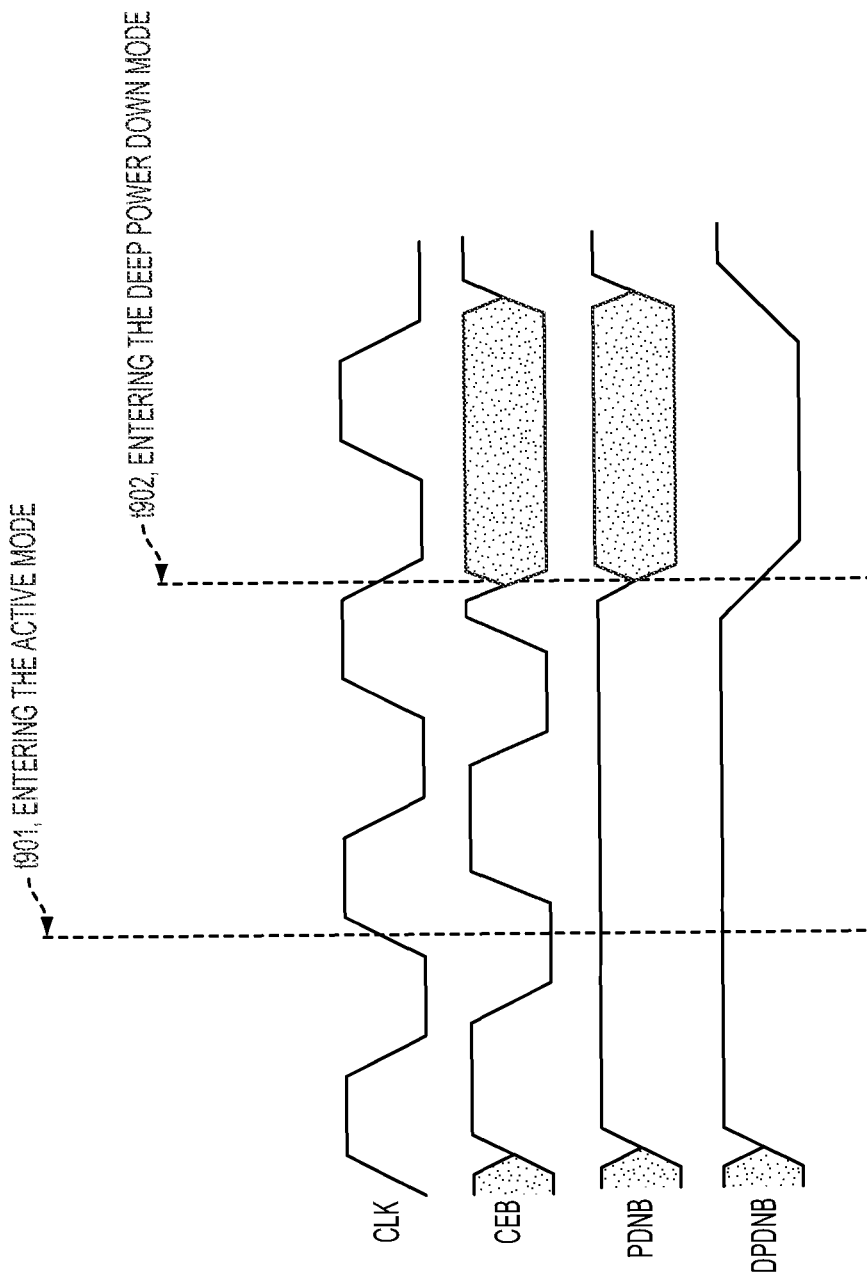
FIG. 9 is a graph of waveforms illustrating the memory circuit in FIG. 1 transitioning from the active mode to the deep power down mode, in accordance with some embodiments.

FIG. 9 is a graph of waveforms illustrating circuit 100 transitioning from the active mode to the deep power down mode. In the active mode, both signals DPDNB and PDNB are High. For illustration, circuit 100 enters the active mode at time t901. Further, at time t902 when signal DPDNB transitions from a High to a Low, circuit 100 enters the deep power down mode from the active mode independent of the logic level of clock CLK, signal CEB, or signal PDNB.

Figure 10:
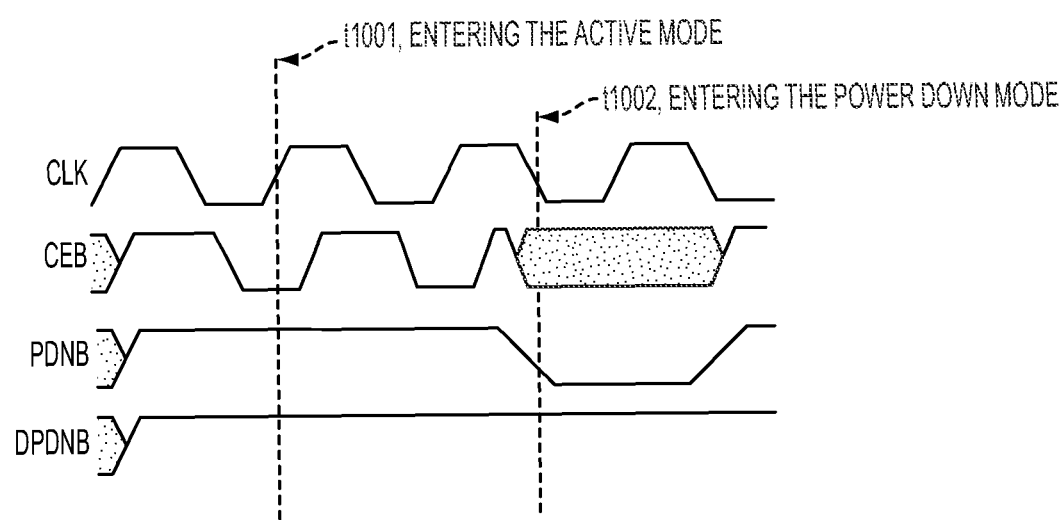
FIG. 10 is a graph of waveforms illustrating the memory circuit in FIG. 1 transitioning from the active mode to the power down mode, in accordance with some embodiments.

FIG. 10 is a graph of waveforms illustrating circuit 100 transitioning from the active mode to the power down mode. In the active mode, both signals DPDNB and PDNB are High. For illustration, circuit 100 enters the active mode at time t1001. At time t1002 when signal PDND transitions from a High to a Low, circuit 100 enters the power down mode from the active mode independent of the logic level of clock CLK and signal CEB. Signal DPDNB, however, continues to be High.

Figure 11:
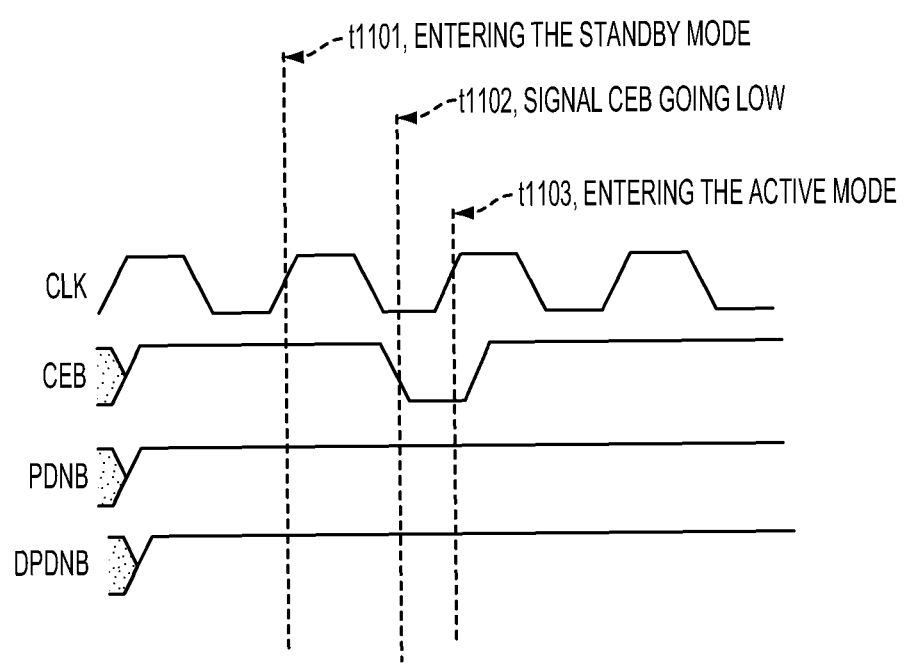
FIG. 11 is a graph of waveforms illustrating the memory circuit in FIG. 1 transitioning from the standby mode to the active mode, in accordance with some embodiments.

FIG. 11 is a graph of waveforms illustrating circuit 100 transitioning from the standby mode to the active mode. Both signals PDNB and DPDNB are High in both the standby mode and the active mode. For illustration, circuit 100 enters the active mode at time t1101. At time t1102, signal CEB transitions from a High to a Low. At time t1103 when clock CLK first rises to a High after signal CEB is Low, circuit 100 enters the active mode.

Figure 12:
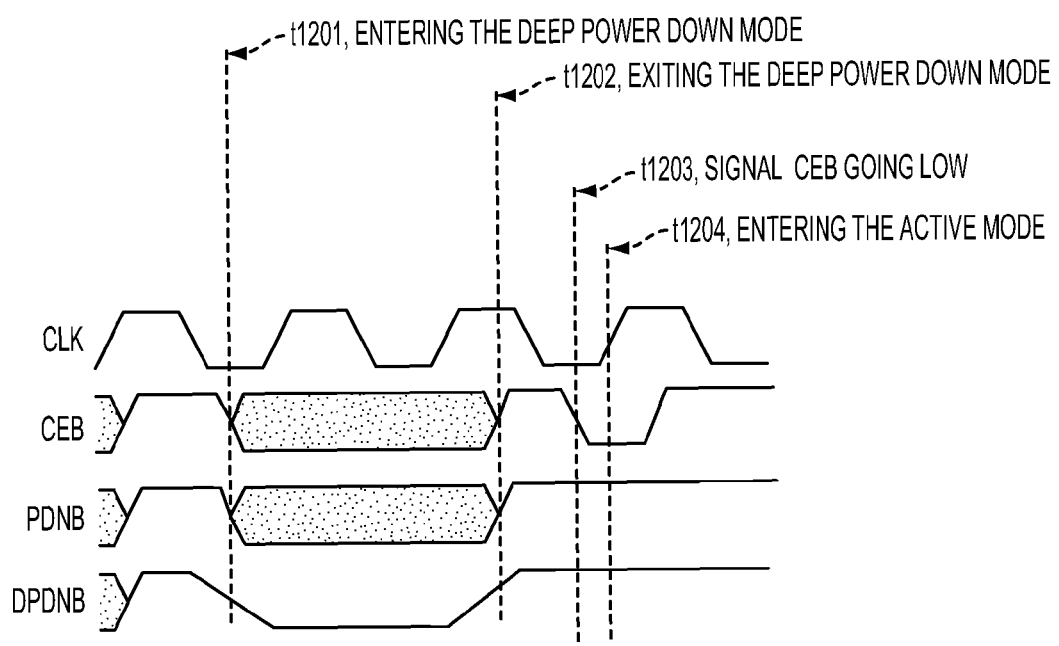
FIG. 12 is a graph of waveforms illustrating the memory circuit in FIG. 1 transitioning from the deep power down mode to the active mode, in accordance with some embodiments.

FIG. 12 is a graph of waveforms illustrating circuit 100 transitioning from the deep power down mode to the active mode. For illustration, circuit 100 enters the deep power down mode at time t1201. At time t 1202 circuit 100 exits the deep power down mode when signal DPDNB rises to a High, independent of clock CLK, signal CEB and signal PDNB. At time t1203, signal CEB transitions from a High to a Low. At time t1204 when signal PDNB is High and clock CLK first rises to a High after signal CEB is Low, circuit 100 enters the active mode.

Figure 13:
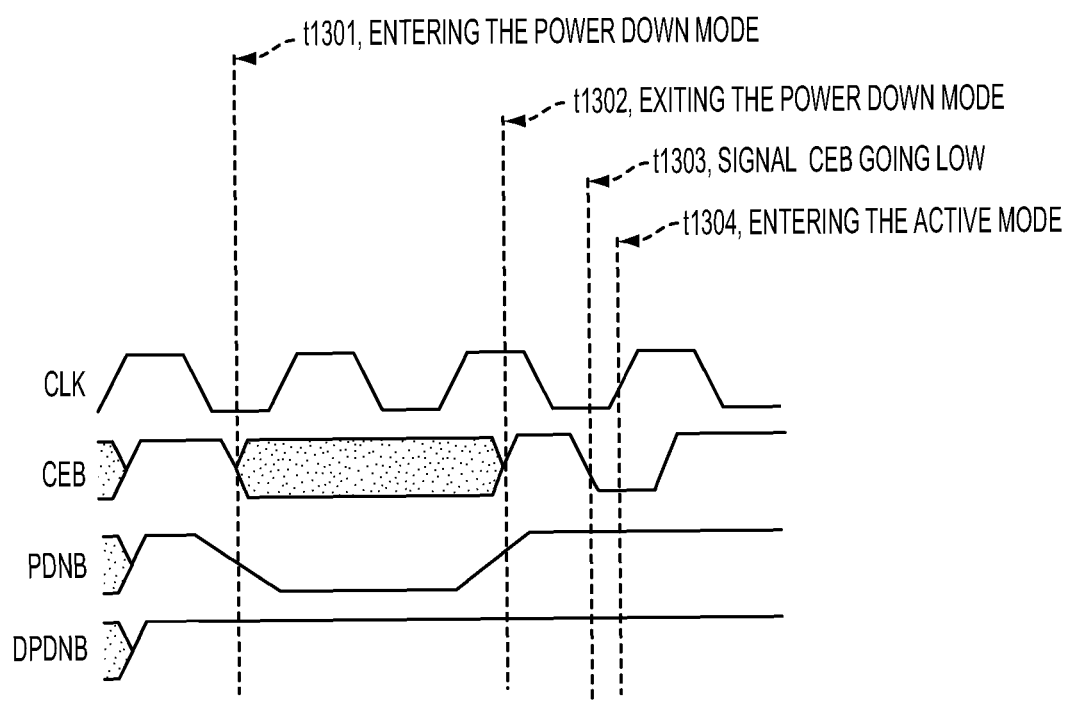
FIG. 13 is a graph of waveforms illustrating the memory circuit in FIG. 1 transitioning from the power down mode to the active mode, in accordance with some embodiments.

FIG. 13 is a graph of waveforms illustrating circuit 100 transitioning from the power down mode to the active mode. Signal DPDNB is High in both the power down mode and the active mode. For illustration, circuit 100 enters the power down mode at time t1301. At time t 1302, circuit 100 exits the power down mode when signal PDNB rises to a High, independent of clock CLK and signal CEB. At time t1303, signal CEB transitions from a High to a Low. At time 1304 when clock CLK first rises to a High after signal CEB is Low, circuit 100 enters the active mode.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments.

Some embodiments regard a circuit comprising a first voltage source, a second voltage source, a first switching circuit, first transistors, and a control circuitry. The first switching circuit is configured to selectively couple the first voltage source or the second voltage source to a first signal line. The first transistors are in an IO circuitry and have first bulks configured to receive the first signal line. The control circuitry is configured to receive a clock and a command signal on a command signal line, and generate a first control signal on a first control signal line to control the first switch based on the clock and the command signal.

Some embodiments regard a method for reducing leakage current in a memory macro. In the method, a first operational mode of the memory macro was changed to a second operational mode. A first voltage value at first bulks of transistors of an input output (IO) circuitry of the memory macro is changed to a second voltage value. The first voltage value at bulks of transistors of a memory circuitry of the memory macro is maintained. The IO circuitry carries first data for a write operation to memory cells in the memory circuitry and second data for a read operation from the memory cells in the memory circuitry. The first operational mode includes at least one of the read operation and the write operation. The second operational mode prohibits the read operation and the write operation.

Some embodiments regard a memory circuit. The circuit comprises a first voltage source, a second voltage source, a first switching circuit, and first transistors. The first switching circuit is configured to selectively couple the first voltage source or the second voltage source to a first signal line. The first transistors are in an IO circuitry and have first bulks configured to receive the first signal line. The circuit is configured to operate in a first operational mode and in at least one of a second operational mode, a third operational mode or a fourth operational mode. In the first operational mode, the circuit is configured to have a read operation or a write operation, and the first switching circuit is configured to electrically couple the first voltage source to the first signal line. The first bulks thereby have a first voltage value from the first voltage source. In the second, the third, or the fourth operational mode, the first switching circuit is configured to electrically couple the second voltage source to the first signal line. The first bulks thereby have a second voltage value from the second voltage source.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
a first voltage source and a second voltage source;
a first switching circuit configured to selectively couple the first voltage source or the second voltage source to a first signal line;
first transistors in an IO circuitry having first bulks configured to receive the first signal line; and
a control circuitry configured to receive a clock and a command signal on a command signal line and generate a first control signal on a first control signal line to control the first switching circuit based on the clock and the command signal.

2. The circuit of claim 1, wherein
the circuit operates in at least a first mode and a second mode based on the clock and logic levels of the command signal;
the first switching circuit is configured to couple the first voltage source to the first signal line when the circuit operates in the first mode; and
the first switching circuit is configured to couple the second voltage source to the first signal line when the circuit operates in the second mode.

3. The circuit of claim 2, wherein the circuit is configured to operate in at least one of a third mode and a fourth mode, and the first switching circuit is configured to couple the second voltage source to the first signal line when the circuit operates in the third mode or the fourth mode.

4. The circuit of claim 2, wherein
the circuit is configured to enter the first mode when the command signal line has a first command logic level and a first edge of the clock has a first transition since the command signal line having the first command logic level; and
the circuit is configured to enter the second mode when the command signal line has a second command logic level and a second edge of the clock has a first transition since the command having the second command logic level.

5. The circuit of claim 1, further comprising:
a third voltage source and a fourth voltage source;
a second switching circuit configured to selectively couple the third voltage source or the fourth voltage source to a second signal line; and
second transistors in the IO circuitry having second bulks configured to receive the second signal line.

6. The circuit of claim 5 further comprising a sub-circuit configured to generate a second control signal from the first control signal, the first control signal line configured to control the first switching circuit and the second control signal line configured to control the second switching circuit.

7. The circuit of claim 1, wherein
the first voltage source is configured to provide an operational voltage and the second voltage source is configured to provide a first voltage higher than the operational voltage; or
the first voltage source is configured to provide a reference voltage and the second voltage source is configured to provide a second voltage lower than the reference voltage.

8. A method for reducing leakage current in a memory macro, comprising:
changing from a first operational mode to a second operational mode of the memory macro;
changing a first voltage value at first bulks of transistors of an input/output circuitry of the memory macro to a second voltage value; and
maintaining the first voltage value at bulks of transistors of a memory circuitry of the memory macro,
wherein
the IO circuitry carries first data for a write operation to memory cells in the memory circuitry and second data for a read operation from the memory cells in the memory circuitry; and
the first operational mode includes at least one of the read operation and the write operation, and the second operational mode prohibits the read operation and the write operation.

9. The method of claim 8, wherein changing from the first operational mode to the second operational mode comprises:
causing a command signal to transition from a first command logic value to a second command logic value; and
entering the second operational mode when a clock signal first transitions from a first clock logic value to a second clock logic value since the command signal has the second command logic value.

10. The method of claim 8, wherein changing the first voltage value at the bulks of the transistors of the IO circuitry comprises raising the first voltage value if the transistors of the IO circuitry are PMOS transistors, and/or lowering the first voltage value if the transistors of the IO circuitry are NMOS transistors.

11. The method of claim 8 further comprising:
changing from the second operational mode to the first operational mode; and
changing the second voltage value at the bulks of the transistors of the IO circuitry to the first voltage value.

12. The method of claim 11, wherein changing from the second operational mode to the first operational mode comprises:
causing a command signal to transition from a first command logic value to a second command logic value; and
entering the first operational mode when a clock signal first transitions from a first clock logic value to a second clock logic value since the command signal has the second command logic value.

13. The method of claim 8, further comprising refreshing memory cells in the memory circuitry while the memory macro operates in the second operational mode.

14. The method of claim 8, wherein changing the first voltage value at the bulks of the transistors of the IO circuitry of the memory macro to the second voltage value comprising switching a first voltage source to a second voltage source to the bulks of the transistors.

15. The method of claim 8, wherein, when the memory macro is in the second operational mode, at least one of the following conditions is met:
there is no switching activity in the IO circuitry;
the clock is cut off;
a data refresh is stopped;
internal power supplies are disabled; and
an operational voltage is cut off.

16. A memory circuit comprising:
a first voltage source and a second voltage source;
a first switching circuit configured to selectively couple the first voltage source or the second voltage source to a first signal line;
first transistors in an IO circuitry having first bulks configured to receive the first signal line,
wherein
the circuit is configured to operate in a first operational mode and in at least one of a second operational mode, a third operational mode or a fourth operational mode;
in the first operational mode, the circuit is configured to have a read operation or a write operation, and the first switching circuit is configured to electrically couple the first voltage source to the first signal line, the first bulks thereby having a first voltage value from the first voltage source;
in the second, the third, or the fourth operational mode, the first switching circuit is configured to electrically couple the second voltage source to the first signal line, the first bulks thereby having a second voltage value from the second voltage source.

17. The memory circuit of claim 16, further comprising:
a third voltage source and a fourth voltage source;
a second switching circuit configured to selectively couple the third voltage source or the fourth voltage source to a second signal line; and
second transistors in the IO circuitry having second bulks configured to receive the second signal line.

18. The memory circuit of claim 17 further comprising a sub-circuit configured to generate a second control signal from a first control signal, the first control signal line configured to control the first switching circuit and the second control signal line configured to control the second switching circuit.

19. The memory circuit of claim 16, wherein
the memory circuit is configured to enter the first mode when a command signal line has a first command logic value and a first edge of the clock has a first transition since the command signal line having the first command logic value; and
the memory circuit is configured to enter the second mode when the command signal line has a second command logic value and a second edge of the clock has a first transition since the command having the second command logic value.

20. The memory circuit of claim 16, wherein
the first voltage source is configured to provide an operational voltage and the second voltage source is configured to provide a first voltage higher than the operational voltage; or
the first voltage source is configured to provide a reference voltage and the second voltage source is configured to provide a second voltage lower than the reference voltage.

* * * * *